(12) United States Patent
Erdmann

(10) Patent No.: US 8,830,094 B1
(45) Date of Patent: Sep. 9, 2014

(54) TIME SKEW EXTRACTION OF INTERLEAVED ANALOG-TO-DIGITAL CONVERTERS

(71) Applicant: Xilinx, Inc., San Jose, CA (US)

(72) Inventor: Christophe Erdmann, Dublin (IE)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 14/132,277

(22) Filed: Dec. 18, 2013

(51) Int. Cl.
*H03M 1/10* (2006.01)
*H03M 1/36* (2006.01)
*H03M 1/00* (2006.01)
*H03M 1/12* (2006.01)

(52) U.S. Cl.
CPC ............ *H03M 1/1023* (2013.01); *H03M 1/365* (2013.01); *H03M 1/00* (2013.01); *H03M 1/12* (2013.01)
USPC .......................................... 341/120; 341/155

(58) Field of Classification Search
CPC .......... H03M 1/12; H03M 1/00; H03M 1/365
USPC .................. 341/120, 118, 155, 122, 159, 110
See application file for complete search history.

(56) References Cited

U.S. PATENT DOCUMENTS 8,659,453 B1 * 2/2014 Low et al. ...................... 341/110

OTHER PUBLICATIONS

Jamal, Shafiq M. et al., "A 10-b 120-Msample/s Time-Interleaved Analog-to-Digital Converter with Digital Background Calibration," *IEEE Journal of Solid-State Circuits*, Dec. 2002, pp. 1618-1627, vol. 37, No. 12, IEEE Piscataway, NJ, USA.
Razavi, Behzad, "Problem of Timing in Interleaved ADCs," *Proc. of the 2012 IEEE Custom Integrated Circuits Conference*, Sep. 9, 2012, pp. 1-8, IEEE, Piscataway, NJ, USA.
Yiwen, Zhang et al., "A 14-bit 200-MS/s time interleaved ADC with sample-time error calibration," *Journal of Semiconductors*, Oct. 2012, pp. 105010-1 to 105010-6, IOP Publishing Ltd., Bristol, United Kingdom.

* cited by examiner

*Primary Examiner* — Joseph Lauture
(74) *Attorney, Agent, or Firm* — Kin-Wah Tong; David Parandoosh

(57) ABSTRACT

An exemplary integrated circuit for performing time skew extraction includes a first subtractor, an array of subtractors separate from the first subtractor, and an array of averaging circuits. Inputs of the first subtractor are coupled to outputs of a plurality of channels of an interleaved analog-to-digital-converter and computes distances between samples of a signal that are measured consecutively by pairs of channels in the plurality of channels. At least some averaging circuits in the array of averaging circuits compute an average of those of the distances that correspond to a respective one of the pairs of channels; one averaging circuit in the array of averaging circuits computes an average of all of the distances. Each subtractor in the array of subtractors computes a difference between an average computed by one of the at least some of the averaging circuits and the average of all of the distances.

19 Claims, 8 Drawing Sheets

TIME SKEW EXTRACTION OF INTERLEAVED ANALOG-TO-DIGITAL CONVERTERS

TECHNICAL FIELD

This disclosure relates generally to integrated circuits and relates more particularly to interleaved analog-to-digital converters used in integrated circuit technology.

BACKGROUND

Modern applications using analog-to-digital converters (ADCs) require an increasing amount of bandwidth. One way to achieve increased bandwidth without appreciable increase in power consumption is to utilize interleaved ADCs, i.e., two or more ADCs having a defined clocking relationship that are used to simultaneously sample an input signal and produce a combined output signal. The output signal of a set of interleaved ADCs results in a sampling bandwidth that is some multiple of the sampling bandwidths of the individual ADCs. Thus, the effective sampling rate can be increased by a factor that is equal to the number of ADCs implemented (e.g., using two ADCs each having a sample rate of fs will result in a sampling bandwidth of 2 fs).

Mismatch of the different interleaved channels can undesirably negate some of the benefits obtained by interleaving. For instance, time skew mismatch is a significant limiting factor when increased bandwidth is sought. Time skew mismatch occurs when the sampling intervals of the interleaved channels are unequal. Consider the case of a two-channel interleaved ADC. The interval between when channel 1 first samples an input signal and when channel 2 first samples the input signal should be equal to the interval between when channel 2 first samples the input signal and when channel 1 samples the input signal for the second time. If these intervals are not equal, a time skew mismatch exists on at least one of the channels. The difference between the two intervals is proportional to the amount of the time skew error.

Conventional time skew extraction techniques use a combination of multipliers and adders. This approach increases the amount of digital resources required, as well as the power consumption of the interleaved ADCs, particularly when dealing with a large number of interleaved channels. This approach also does not work at certain frequencies, and thus requires the use of notch filters to overcome this limitation.

SUMMARY

Time skew extraction of interleaved analog-to-digital converters is disclosed. An exemplary integrated circuit for performing time skew extraction includes a first subtractor, an array of subtractors separate from the first subtractor, and an array of averaging circuits. Inputs of the first subtractor are coupled to outputs of a plurality of channels of an interleaved analog-to-digital-converter and computes distances between samples of a signal that are measured consecutively by pairs of channels in the plurality of channels. At least some averaging circuits in the array of averaging circuits compute an average of those of the distances that correspond to a respective one of the pairs of channels; one averaging circuit in the array of averaging circuits computes an average of all of the distances. Each subtractor in the array of subtractors computes a difference between an average computed by one of the at least some of the averaging circuits and the average of all of the distances. The difference is proportional to a time skew between one of the pairs of the channels corresponding to the average computed by one of the at least some of the averaging circuits.

In various aspects, the integrated circuit further comprises a bit manipulator, for generating absolute values of the distances computed by the first subtractor, wherein the bit manipulator has an input coupled to an output of the first subtractor; the integrated circuit further comprises a demultiplexer for differentiating between the pairs of channels that correspond to each of the absolute values of the distances, wherein an input of the demultiplexer is coupled to an output of the bit manipulator, and each output of the demultiplexer is coupled to an input of one of the at least some of the averaging circuits; the output of the bit manipulator is further coupled to the one averaging circuit in the array of averaging circuits; each subtractor in the array of subtractors has a first input coupled to an output of the one averaging circuit in the array of averaging circuits and a second input coupled to one of the at least some of the averaging circuits; the integrated circuit further comprises a flip flop coupled to the outputs of the plurality of channels, for producing derivatives of the samples; an output of the flip flop is coupled to an input of the first subtractor; the samples comprise instances of digital codes resulting from analog-to-digital conversion of the signal; and outputs of each subtractor in the array of subtractors are coupled to inputs of a calibration loop controller.

According to another aspect, a method for extracting a plurality of time skews between a plurality of channels of an interleaved analog-to-digital converter includes: computing distances between pairs of samples of a signal that are measured consecutively by pairs of channels in the plurality of channels; computing averages of those of the distances corresponding to each of the pairs of channels; computing an average of all of the distances; and computing differences between each of the averages corresponding to each of the pairs of channels and the average of all of the distances, wherein the differences are proportional to the time skews between corresponding pairs of channels.

In various aspects of the method, the extracting is performed without the use of multiplier circuitry; the computing the averages of those of the distances corresponding to each of the pairs of channels and the computing the average of all of the distances both operate on absolute values of the plurality of distances; the absolute values are generated by flipping bits that represent whether the distances have positive or negative values; the computing the distances comprises producing derivatives of the samples, and a derivative of a given one of the samples represents a sample measured on a clock cycle after a clock cycle on which the given one of the samples is measured; the samples comprise instances of digital codes resulting from analog-to-digital conversion of the signal; and the method further includes outputting the differences to a calibration loop controller.

According to another aspect, an integrated circuit includes a flip flop, first and second subtractors, and first and second bit manipulators. The flip flop has an input coupled to an output of a first channel of an interleaved analog-to-digital-converter and to an output of a second channel of the interleaved analog-to-digital-converter, for producing derivatives of samples of a signal that are measured by the first channel and the second channel. The first subtractor has inputs coupled to the output of a first channel, to the output of the second channel, and to an output of the flip flop, for computing distances between the samples and those of the derivatives corresponding to the samples. The first bit manipulator has an input coupled to an output of the first subtractor, for generating the absolute values of those of the distances having odd-numbered values.

The second bit manipulator has an input coupled to an output of the first subtractor, for generating the absolute values of those of the distances having even-numbered values. The second subtractor has inputs coupled to outputs of the first bit manipulator and the second bit manipulator, for computing a difference between absolute values of those of the distances having odd-numbered values and absolute values of those of the distances having even-numbered values.

In a further aspect of the integrated circuit, the integrated circuit further includes an averaging circuit having an input coupled to an output of the second subtractor, for computing an average of the difference over time, wherein the average of the difference represents an average distance of the samples over time; and an output of the averaging circuit is coupled to an input of a calibration loop controller.

BRIEF DESCRIPTION OF THE DRAWINGS

Accompanying drawings show exemplary embodiments in accordance with one or more aspects of the disclosure; however, the accompanying drawings should not be taken to limit the disclosure to the embodiments shown, but are for explanation and understanding only.

DETAILED DESCRIPTION

Time skew extraction of interleaved analog-to-digital converters (ADCs) is disclosed. As discussed above, the performance of an integrated circuit including interleaved ADCs can be limited by time skew mismatch between the interleaved channels of the ADCs, which run on separate clocks. Conventional time skew extraction solutions based on the use of a combination of adders and multipliers undesirably increase the power consumption of the integrated circuit. As disclosed herein, time skew extraction is accomplished while conserving power by using subtractor circuitry only (i.e., the use of multipliers, which are more resource-hungry, is not necessary). The interleaved absolute values of the odd and even signal derivatives are compared and used to extract an average distance of the signal samples over time. This average distance is proportional to the time skew and thus can be used to calibrate the interleaved ADC to correct for the time skew mismatch.

Figure 1:
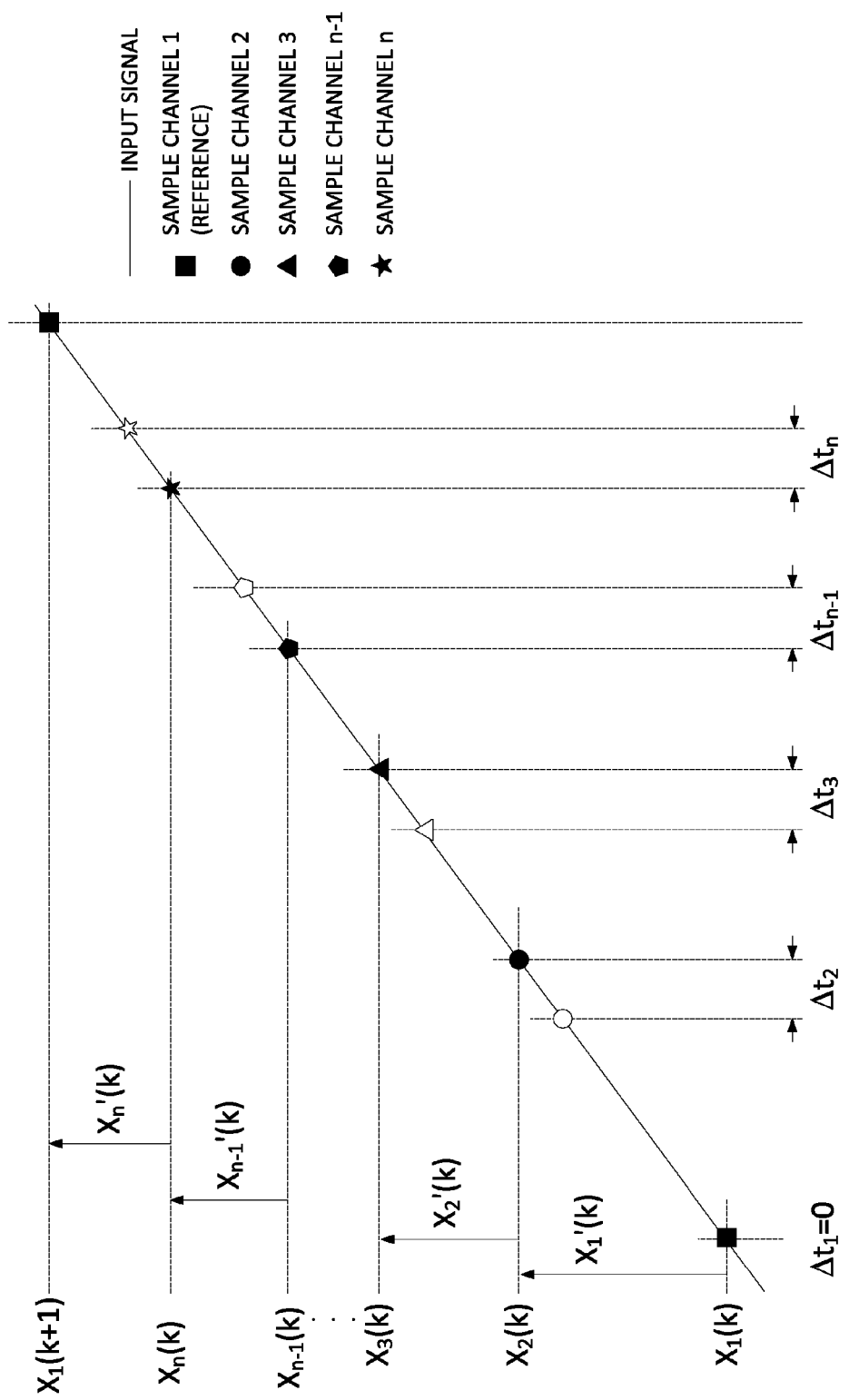
FIG. 1 is a graph illustrating an exemplary input signal that is sampled by an n-channel interleaved analog-to-digital converter.

FIG. 1 is a graph illustrating an exemplary input signal that is sampled by an n-channel interleaved analog-to-digital converter. As illustrated, sample channel 1 of the ADC takes its first sample $x_1(k)$ of the input signal. Next, sample channel 2 of the ADC takes its first sample $x_2(k)$ of the input signal. The sample channels continue in order until sample channel n takes its first sample $x_n(k)$ of the input signal; then, each sample channel takes its second sample of the input signal, starting with sample channel 1 taking its second sample $x_1(k+1)$.

Ideally, the distance (e.g., time difference) between each pair of consecutive sample channels' samples should be equal. For instance, the distance between sample channel 1's first sample and sample channel 2's first sample (i.e., $x_1'(k)$) should be equal to the distance between sample channel 3's first sample and sample channel 2's first sample (i.e., $x_2'(k)$). However, it can be visually ascertained from FIG. 1 that $x_1'(k)$ is larger than $x_2'(k)$. The difference between these two values is proportional to the time skew error $\Delta t$ on sample channel 2. It is the amount of this time skew error that the present disclosure seeks to extract.

Figure 2:
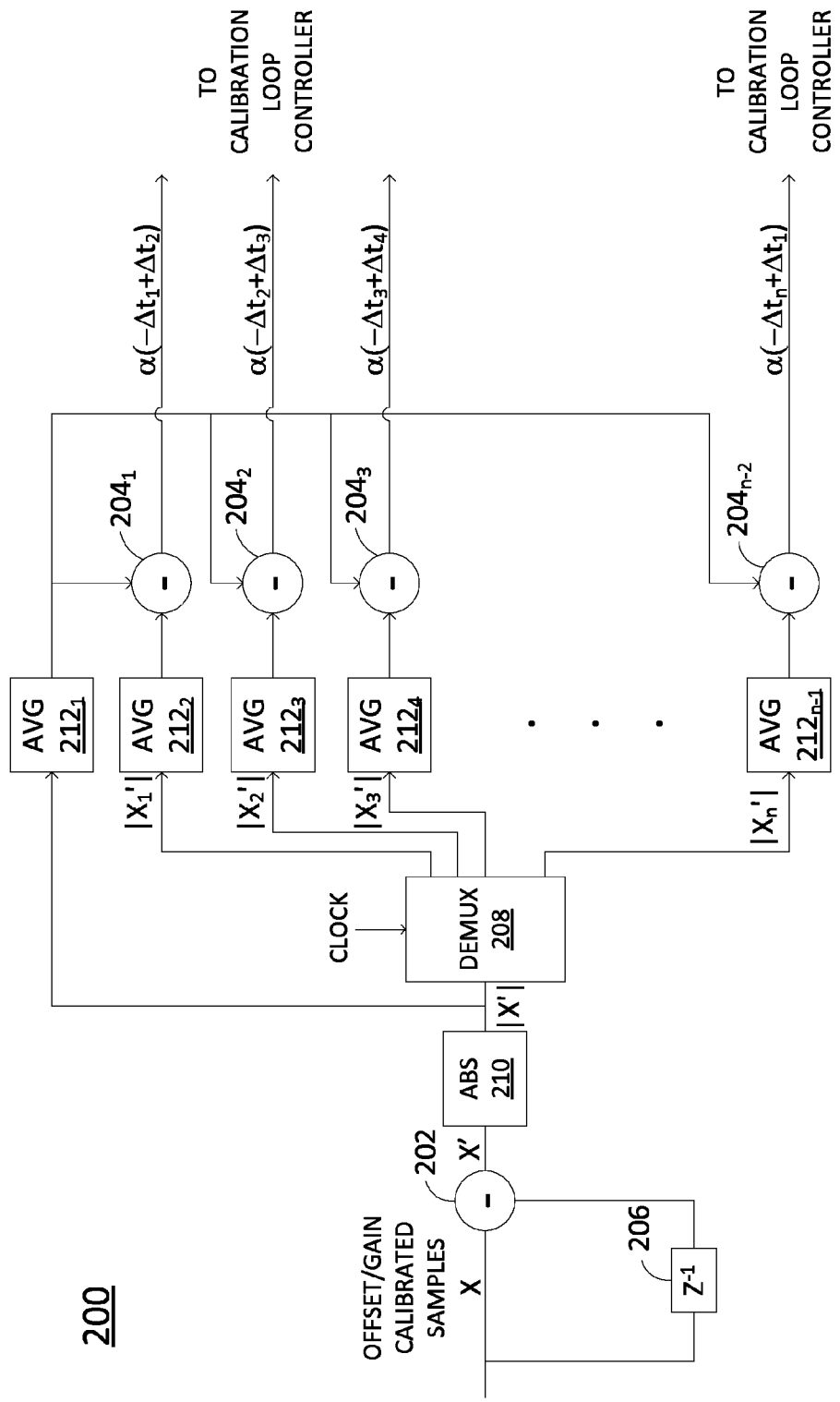
FIG. 2 is a schematic diagram an exemplary time skew extractor circuit.

FIG. 2 is a schematic diagram an exemplary time skew extractor circuit 200. The time skew extractor circuit 200 is configured to extract time skew for an n-channel interleaved ADC, such as the type that might generate the samples illustrated in FIG. 1.

The time skew extractor circuit 200 generally comprises a first subtractor 202, an array of n second subtractors (comparators) $204_1$-$204_n$ (hereinafter collectively referred to as "second subtractors 204"), a flip flop 206, a demultiplexer 208, a bit manipulator 210, and an array of n+1 averaging circuits $212_1$-$212_{n+1}$ (hereinafter collectively referred to as "averaging circuits 212"). The inputs of the first subtractor 202 and the flip flop 206 are coupled to the outputs of the n individual channels of the ADC, whereas the outputs of the averaging circuits 212 are coupled to the input of, for example, a calibration loop controller.

The first subtractor 202 and the flip flop 206 receive the offset/gain calibrated samples of the signal x from the n channels of the interleaved ADC. The signal x has been converted from analog to digital form; the samples of the signal x comprise instances of the resultant digital codes (i.e., digital numbers representing the analog signal) that have been measured by the n respective channels. As will be described in further detail below, the time differences between the samples can be indirectly measured from these digital codes.

The flip flop 206 produces the derivative x of each sample (e.g., the sample received or measured on the next clock cycle after the clock cycle on which the initial sample is received or measured) and forwards this derivative to the first subtractor 202, which includes an input coupled to the output of the flip flop 206. The first subtractor 202 then performs signal differentiation to obtain the distances x' between each consecutive pair of samples. The distances are forwarded to the bit manipulator 210, which has an input coupled to the output of the first subtractor 202.

The bit manipulator 210 manipulates the bits of the received distances x' to produce the absolute values of the received distances |x'| (e.g., by simply flipping a bit representing whether the distance has a positive or negative value). The output of the bit manipulator 210 (i.e., |x'|) is then forwarded by the bit manipulator 210 to the demultiplexer 208, which has an input coupled to the output of the bit manipulator 210. In addition, the output of the bit manipulator 210 is also forwarded to a first averaging circuit $212_1$ in the array of averaging circuits 212. Unlike the remainder of the averaging circuits 212 in the array, the input of the first averaging circuit $212_1$ is coupled directly to the output of the bit manipulator 210 rather than to an output of the demultiplexer 208, as described in further detail below.

The first averaging circuit $212_1$ computes the average of all of the distances (i.e., the absolute values of the distances |x'|) output by the bit manipulator 210. This average is forwarded by the first averaging circuit $212_1$ to each of the second subtractors 204, as discussed in further detail below.

The demultiplexer 208 splits the output of the bit manipulator 210 (i.e., the absolute values of the computed distances) into n outputs, each of the n outputs representing the distances between samples generated by a consecutive pair of sample channels (i.e., |x1'|, |x2'|, |x3'| ... |xn'|). Thus, the demultiplexer differentiates between the pairs of channels that correspond to each computed distance. Each of the n outputs is forwarded to at least one of the remaining averaging circuits 212. Thus, the outputs of the demultiplexer 208 are coupled to the inputs of respective ones of the averaging circuits 212. Each of the averaging circuits 212 (save for the first averaging circuit $212_1$) computes the average distance between consecutive samples generated by a pair of sample channels. These averages are then forwarded by the averaging circuits 212 to respective ones of the second subtractors 204.

Thus, the outputs of each of the averaging circuits 212 are coupled to the inputs of one of the second subtractors 204. In addition, each of the second subtractors 204 includes an input that is coupled to the output of the first averaging circuit $212_1$.

The second subtractors 204 each then computes the difference between an individual output of the demultiplexer 208 (i.e., a distance between one pair of samples) and the average of all distances between all pairs of samples as computed by the first averaging circuit $212_1$. The second subtractors 210 operate on the absolute values of the sample distances, as discussed above.

The computed differences represent the distances of the samples over time on a respective pair of sample channels, and are thus proportional to the average time skews ($\alpha \Delta t$) for the respective pairs of sample channels. In general, the average time skew between sample channels i and i+1 is $\alpha(-\Delta t_i + \Delta t_{i+1})$. The second subtractors 204 may then forward the average time skews to a calibration loop controller (not shown), which performs a correction to compensate for the time skew. The exact configuration of the calibration loop controller may vary and is considered outside the scope of the present disclosure.

The time skew extractor circuit 200 thus allows for efficient extraction of time skew among the interleaved channels of an ADC in a manner that requires less circuitry and less power than conventional solutions. Moreover, while conventional solutions are unable to extract time skew mismatch at certain frequencies, the disclosed time skew extractor circuit 700 does not suffer from this drawback since it operates on the derivative of the sampled signal rather than on the signal itself.

Figure 3:
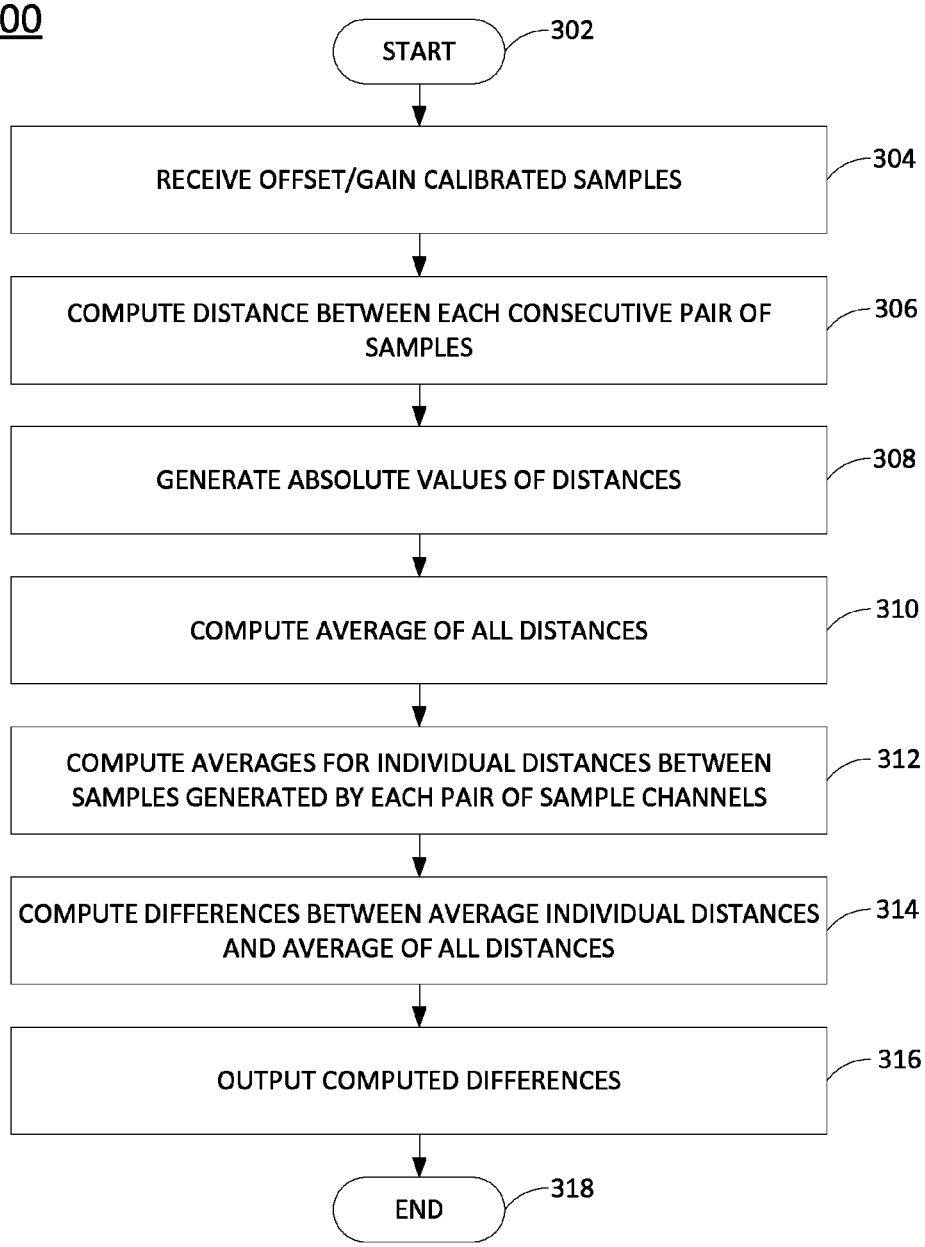
FIG. 3 is a flow diagram illustrating a method for extracting time skew among the n interleaved channels of an analog-to-digital converter.

FIG. 3 is a flow diagram illustrating a method 300 for extracting time skew among the n interleaved channels of an analog-to-digital converter. The method 300 may be implemented, for example, by a time skew extractor circuit such as the circuits 200 illustrated in FIG. 2. For ease of illustration, reference is made in the discussion of the method 300 to various components of the time skew extractor circuit 200. However, the method 300 is not necessarily limited to implementation in a circuit configured precisely as illustrated in FIG. 2; thus, such references are intended to be illustrative rather than limiting.

The method 300 begins in step 302. In step 304, the flip flop 206 receives the offset/gain calibrated samples measured by the interleaved channels of the ADC. As discussed above, the samples comprise instances of the digital codes (i.e., digital numbers representing the analog signal) resulting from conversion of the input signal.

In step 306, the first subtractor 202 computes the distances (e.g., $x_1'(k), x_2'(k), \ldots, X_n'(k)$) between each consecutive pair of samples (e.g., between a sample and its derivative).

In step 308, the bit manipulator 210 generates the absolute values of the distances computed by the first subtractor 202. As discussed above, this results in the generation of |x'|.

In step 310, the first averaging circuit $212_1$ computes the average of all of the distances (i.e., the absolute values of the distances |x'|) generated by the bit manipulator 210.

In step 312, each of the remaining averaging circuits 212 computes the individual average distances between consecutive samples generated by each pair of sample channels. That is, the average values of $|x_1'|, |x_2'|, \ldots |x_n'|$ are computed.

In step 314, each of the second subtractors 204 computes the difference between a respective average individual distance and the average of all distances.

In step 316, the second subtractors 204 output the computed differences. The differences represent the average distance of the samples over time for a respective pair of sample channels, and are thus proportional to the average time skew ($\alpha \Delta t$) for the respective pairs of sample channels. In general, the average time skew between sample channels i and i+1 is $\alpha(-\Delta t_i + \Delta t_{i+1})$. The differences may be output directly to a calibration loop controller or other device that is capable of calibrating the ADC to compensate for the time skew. In one example, the calibration loop controller (or other device) uses the differences to adjust the individual average distances so that they are equal to the average of all distances.

The method 300 ends in step 318.

Figure 4:
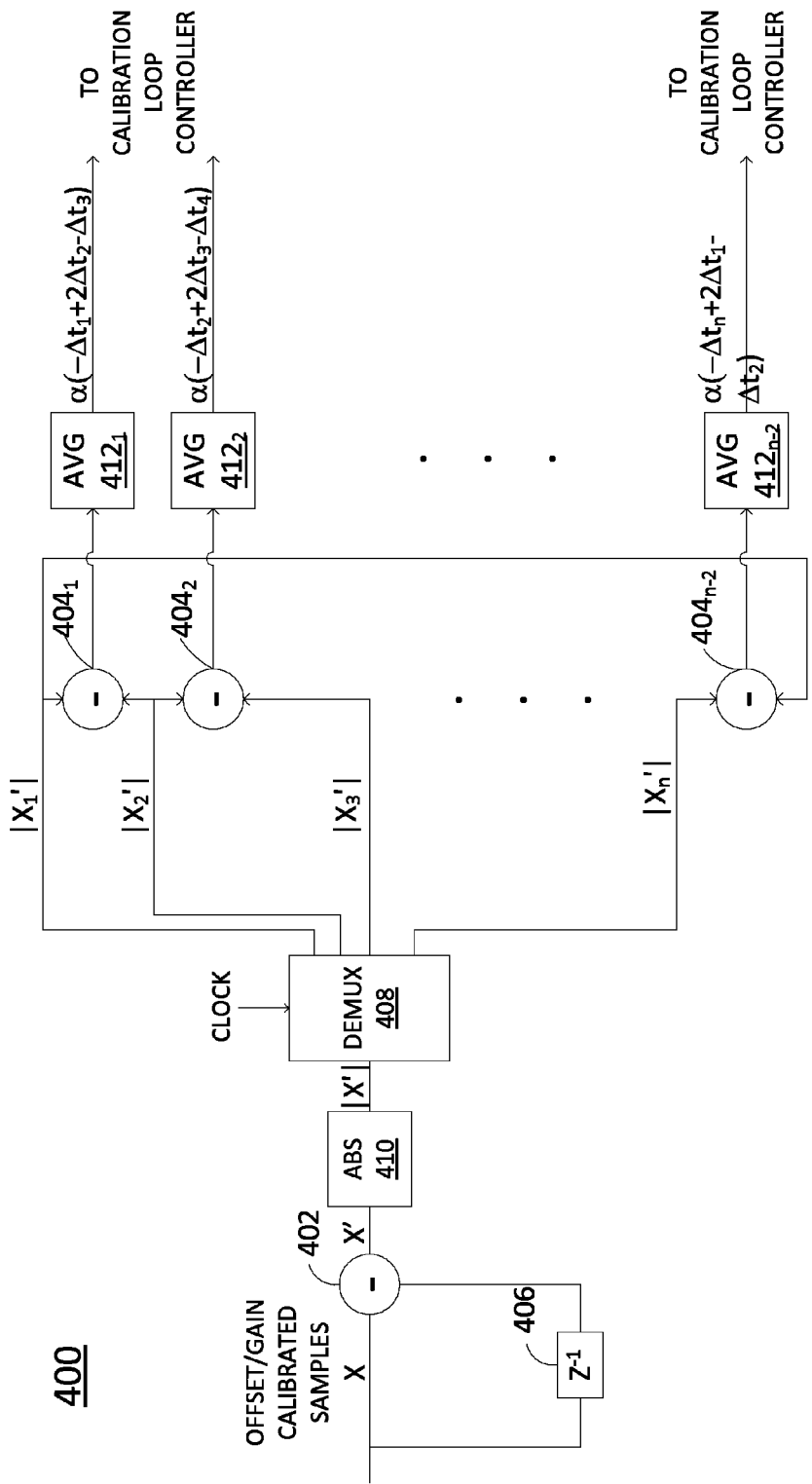
FIG. 4 is a schematic diagram illustrating another exemplary time skew extractor circuit.

FIG. 4 is a schematic diagram illustrating another exemplary time skew extractor circuit 400. Like the circuit 200, the time skew extractor circuit 500 is configured to extract time skew for an n-channel interleaved ADC. However, unlike the circuit 200, the time skew extractor circuit 400 does not compare the individual average distances between pairs of sample channels to the average of all distances.

The time skew extractor circuit 400 generally comprises a first subtractor 402, an array of n–1 second subtractors (comparators) $404_1$-$404_{n-1}$ (hereinafter collectively referred to as "second subtractors 404"), a flip flop 406, a demultiplexer 408, a bit manipulator 410, and an array of n–1 averaging circuits $412_1$-$412_{n-1}$ (hereinafter collectively referred to as "averaging circuits 412"). The inputs of the first subtractor 402 and the flip flop 406 are coupled to the outputs of the n individual channels of the ADC, whereas the outputs of the averaging circuits 412 are coupled to the input of, for example, a calibration loop controller.

The first subtractor 402 and the flip flop 406 receive the offset/gain calibrated samples of the signal x from the n channels of the interleaved ADC. The signal x has been converted from analog to digital form; the samples of the signal x comprise instances of the resultant digital codes (i.e., digital numbers representing the analog signal) that have been measured by the n respective channels. As discussed above, the time differences between the samples can be indirectly measured from these digital codes.

The flip flop 406 produces the derivative x of each sample (e.g., the sample received or measured on the next clock cycle after the clock cycle on which the initial sample is received or measured) and forwards this derivative to the first subtractor 402, which includes an input coupled to the output of the flip flop 406. The first subtractor 402 then performs signal differentiation to obtain the distances (e.g., $x_1(k), x_2(k), \ldots, x_n(k)$) between the consecutive samples measured by each pair of sample channels. The distances are forwarded to the bit manipulator 410, which has an input coupled to the output of the first subtractor 402.

The bit manipulator 410 manipulates the bits of the received distances to produce the absolute values of the received distances (e.g., by simply flipping a bit representing whether the distance has a positive or negative value). The output of the bit manipulator 410 (i.e., |x'|) is then forwarded by the bit manipulator 410 to the demultiplexer 408, which has an input coupled to the output of the bit manipulator 410.

The demultiplexer 408 splits the output of the bit manipulator 410 (i.e., the absolute values of the computed distances) into n outputs, each of the n outputs representing the distances between samples generated by a consecutive pair of sample channels (i.e., |x1|, |x2'|, |x3'| . . . |xn'|). Thus, the demultiplexer differentiates between the pairs of channels that correspond to each computed distance. Each of the n outputs is forwarded to at least one of the second subtractors 404. Thus, the outputs of the demultiplexer 408 are coupled to the inputs of respective ones of the second subtractors 404.

The second subtractors 404 each then computes the difference between the outputs of the demultiplexer 408 from which their inputs were received. Thus, each of the second subtractors 404 computes a difference between the absolute values of a pair of consecutive distances. The second subtractors 410 operate on the absolute values of the sample distances, as discussed above.

The respectively computed differences may then be forwarded by the second subtractors 410 to a respective one of the averaging circuits 412. Each of the averaging circuits 412 the average distance between consecutive samples generated by a pair of sample channels. This average represents the average distance of the samples over time for the particular pair of sample channels, and is thus proportional to the average time skew ($\alpha \Delta t$) between that pair of sample channels. In general, the average time skew between sample channels i and i+1 is $\alpha(-\Delta t_i + 2\Delta t_{i+1} - \Delta t_{i+2})$. The averaging circuits 412 may then forward the average time skews to a calibration loop controller (not shown), which performs a correction to compensate for the time skew. The exact configuration of the calibration loop controller may vary and is considered outside the scope of the present disclosure.

Figure 5:
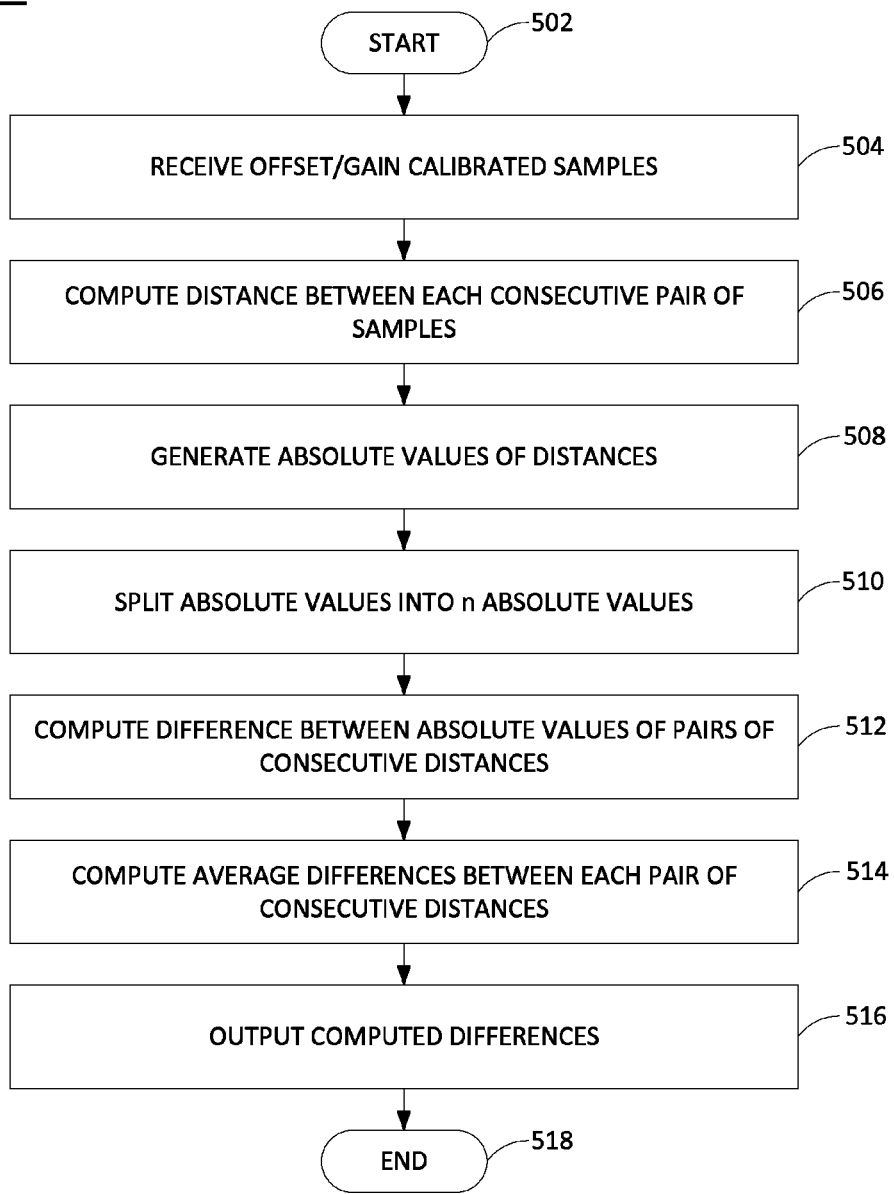
FIG. 5 is a flow diagram illustrating another method for extracting time skew among the n interleaved channels of an analog-to-digital converter.

FIG. 5 is a flow diagram illustrating another method 500 for extracting time skew among the n interleaved channels of an analog-to-digital converter. The method 500 may be implemented, for example, by a time skew extractor circuit such as the circuits 400 illustrated in FIG. 4. For ease of illustration, reference is made in the discussion of the method 500 to various components of the time skew extractor circuit 400. However, the method 500 is not necessarily limited to implementation in a circuit configured precisely as illustrated in FIG. 4; thus, such references are intended to be illustrative rather than limiting.

The method 500 begins in step 502. In step 504, the flip flop 406 receives the offset/gain calibrated samples measured by the interleaved channels of the ADC. As discussed above, the samples comprise instances of the digital codes (i.e., digital numbers representing the analog signal) resulting from conversion of the input signal.

In step 506, the first subtractor 402 computes the distances (e.g., $x_1'(k)$, $x_2'(k)$, . . . , $x_n'(k)$) between each consecutive pair of samples (e.g., between a sample and its derivative).

In step 508, the bit manipulator 410 generates the absolute values of the distances computed by the first subtractor 402. As discussed above, this results in the generation of |x'|.

In step 510, the demultiplexer 408 splits the absolute values of the computed distances into n outputs, each of the n outputs representing the absolute value of a distance between a consecutive pair of samples (i.e., |x1'|, |x2'|, |x3'| . . . |xn'|).

In step 512, each of the second subtractors 404 computes a difference between the absolute values of a pair of consecutive distances.

In step 514, each of the averaging circuits 412 computes the average difference between a respective pair of consecutive distances.

In step 516, the averaging circuits 412 output the computed differences. The differences represent the average distance of the samples over time for a respective pair of consecutive distances, and are thus proportional to the average time skew ($\alpha \Delta t$) for the respective pairs of sample channels. In general, the average time skew between sample channels i and i+1 is $\alpha(-\Delta t_i + 2\Delta t_{i+1} - \Delta t_{i+2})$. The differences may be output directly to a calibration loop controller or other device that is capable of calibrating the ADC to compensate for the time skew. In one example, the calibration loop controller (or other device) uses the differences to adjust the individual average distances so that they are equal to the average of all distances.

The method 500 ends in step 518.

Figure 6:
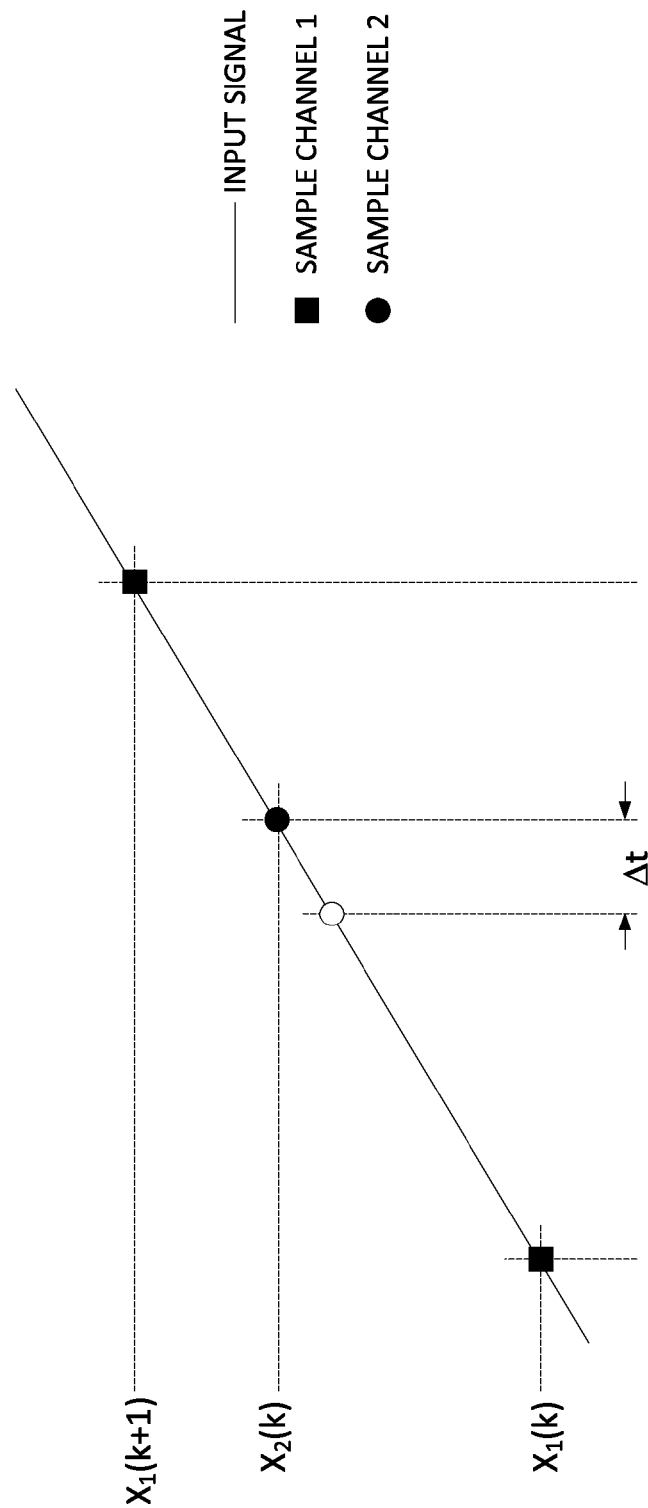
FIG. 6 is a graph illustrating an exemplary input signal that is sampled by a two-channel interleaved analog-to-digital converter.

The simplest case of an interleaved analog-to-digital converter is a two-channel device. In this case, the circuitry for extracting time skew can be greatly simplified. FIG. 6, for example, is a graph illustrating an exemplary input signal that is sampled by a two-channel interleaved analog-to-digital converter. As illustrated, sample channel 1 of the ADC takes its first sample $x_1(k)$ of the input signal. Next, sample channel 2 of the ADC takes its first sample $x_2(k)$ of the input signal. Sample channel 1 then takes its second sample $x_1(k+1)$ of the input signal.

Ideally, the distance (e.g., time difference) between sample channel 1's first sample and sample channel 2's first sample (i.e., $x_2(k)-x_1(k)$) should be equal to the distance between sample channel 1's second sample and sample channel 2's first sample (i.e., $x_1(k+1)-x_2(k)$). However, it can be visually ascertained from FIG. 1 that $x_2(k)-x_1(k)$ is larger than $x_1(k+1)-x_2(k)$. The difference between these two values is proportional to the time skew error $\Delta t$ on sample channel 2.

Figure 7:
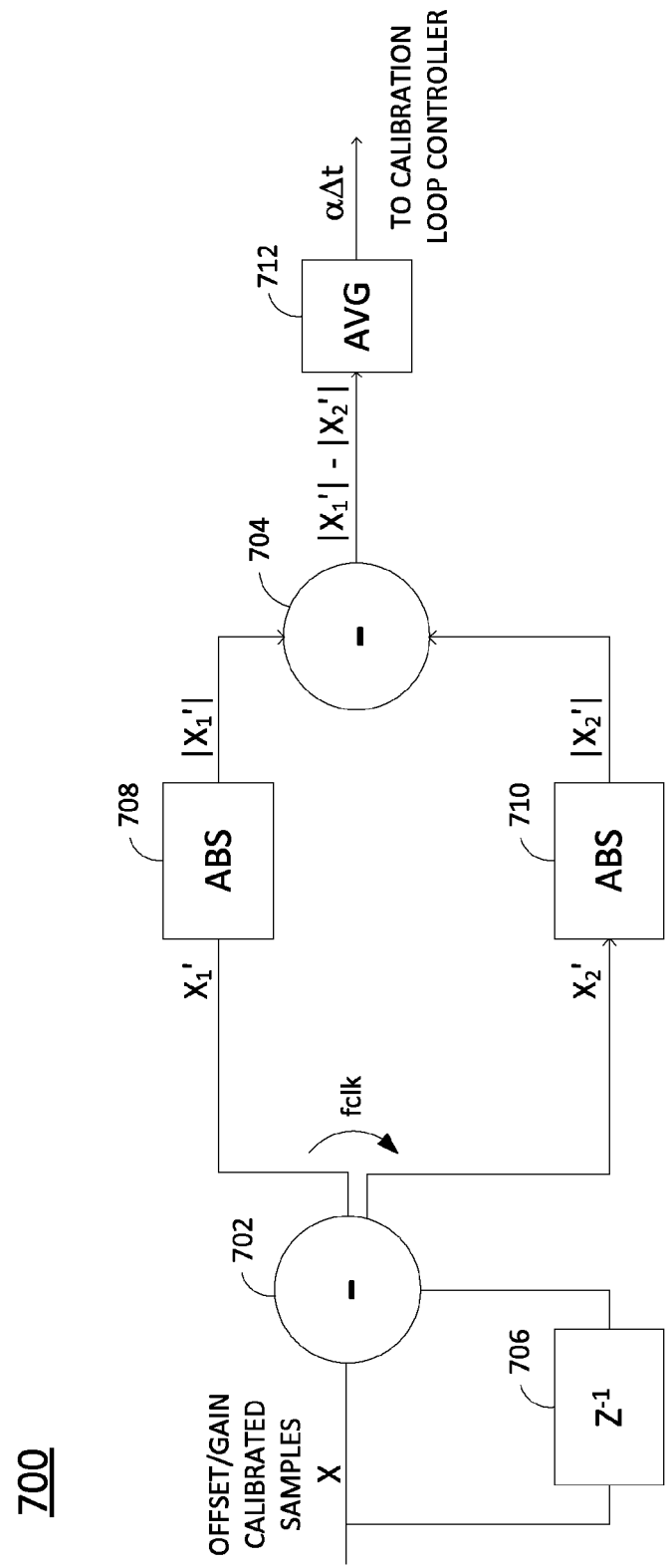
FIG. 7 is a schematic diagram illustrating an exemplary time skew extractor circuit.

FIG. 7 is a schematic diagram illustrating an exemplary time skew extractor circuit 700. In particular, the time skew extractor circuit 700 is configured to extract time skew for a two-channel interleaved ADC.

The time skew extractor circuit 700 generally comprises a first subtractor 702, a second subtractor (comparator) 704, a flip flop 706, a first bit manipulator 708, a second bit manipulator 710, and an averaging circuit 712. The inputs of the first subtractor 702 and the flip flop 706 are coupled to the outputs of the individual channels of the ADCs, whereas the output of the second subtractor 704 is coupled to the input of, for example, a calibration loop controller.

The first subtractor 702 and the flip flop 706 receive the offset/gain calibrated samples of the signal x from the channels of the interleaved ADC. The signal x has been converted from analog to digital form; the samples of the signal x comprise instances of the resultant digital codes (i.e., digital numbers representing the analog signal) that have been measured by the respective channels. As discussed above, the time differences between the samples can be indirectly measured from these digital codes.

The flip flop 706 produces the derivative of each sample (e.g., the sample received or measured on the next clock cycle after the clock cycle on which the initial sample is received or measured) and forwards this derivative to the first subtractor 702, which includes an input coupled to the output of the flip flop 706. The first subtractor 702 then performs signal differentiation to obtain the distances (e.g., $x_2(k)-x_1(k)$; $x_1(k+1)-$ $x_2(k)$; etc.) between each consecutive pair of samples. Distances having odd-numbered values (represented by $x_1'$ in this case) are then forwarded by the first subtractor 702 to the first bit manipulator 708, while distances having even-numbered values (represented by $x_2'$ in this case) are forwarded by the first subtractor 702 to the second bit manipulator 710. Thus, outputs of the first subtractor 702 are coupled to inputs of the first bit manipulator 708 and the second bit manipulator 710.

Each of the first bit manipulator 708 and the second bit manipulator 710 manipulates the bits of the received values to produce the absolute values of the received values (e.g., by simply flipping a bit representing whether the value is positive or negative). As a result, the output of the first bit manipulator 708 ($|x_1'|$) represents all odd absolute values of the signal derivative, and the output of the second bit manipulator 710 ($|x_2'|$) represents all even absolute values of the signal derivative. The outputs of the first bit manipulator 708 and the second bit manipulator 710 (i.e., $|x_1'|$ and $|x_2'|$) are then forwarded by the first bit manipulator 708 and the second bit manipulator 710 to the second subtractor 704. Thus, outputs of the first bit manipulator 708 and the second bit manipulator 710 are coupled to inputs of the second subtractor 704.

The second subtractor 704 then computes the difference between the outputs of the first bit manipulator 708 and the second bit manipulator 710 (i.e., $|x_1'|-|x_2'|$). The second subtractor 704 operates on the absolute values of the sample distances in order to avoid a situation in which distances having positive and negative values result in a zero value. Because the slope of the input signal being converted can rise or fall (e.g., the slope of the input signal illustrates in FIG. 6 rises), the distance between two particular samples could have a positive value or a negative value depending on the slope.

The difference may then be forwarded by the second subtractor 704 to the averaging circuit 712. The averaging circuit 712 computes the average of the differences forwarded by the second subtractor 704. This average represents the average distance of the samples over time, and is thus proportional to the average time skew ($\alpha \Delta t$). The averaging circuit 712 may then forward the average time skew to a calibration loop controller (not shown), which performs a correction to compensate for the time skew. The exact configuration of the calibration loop controller may vary and is considered outside the scope of the present disclosure.

Figure 8:
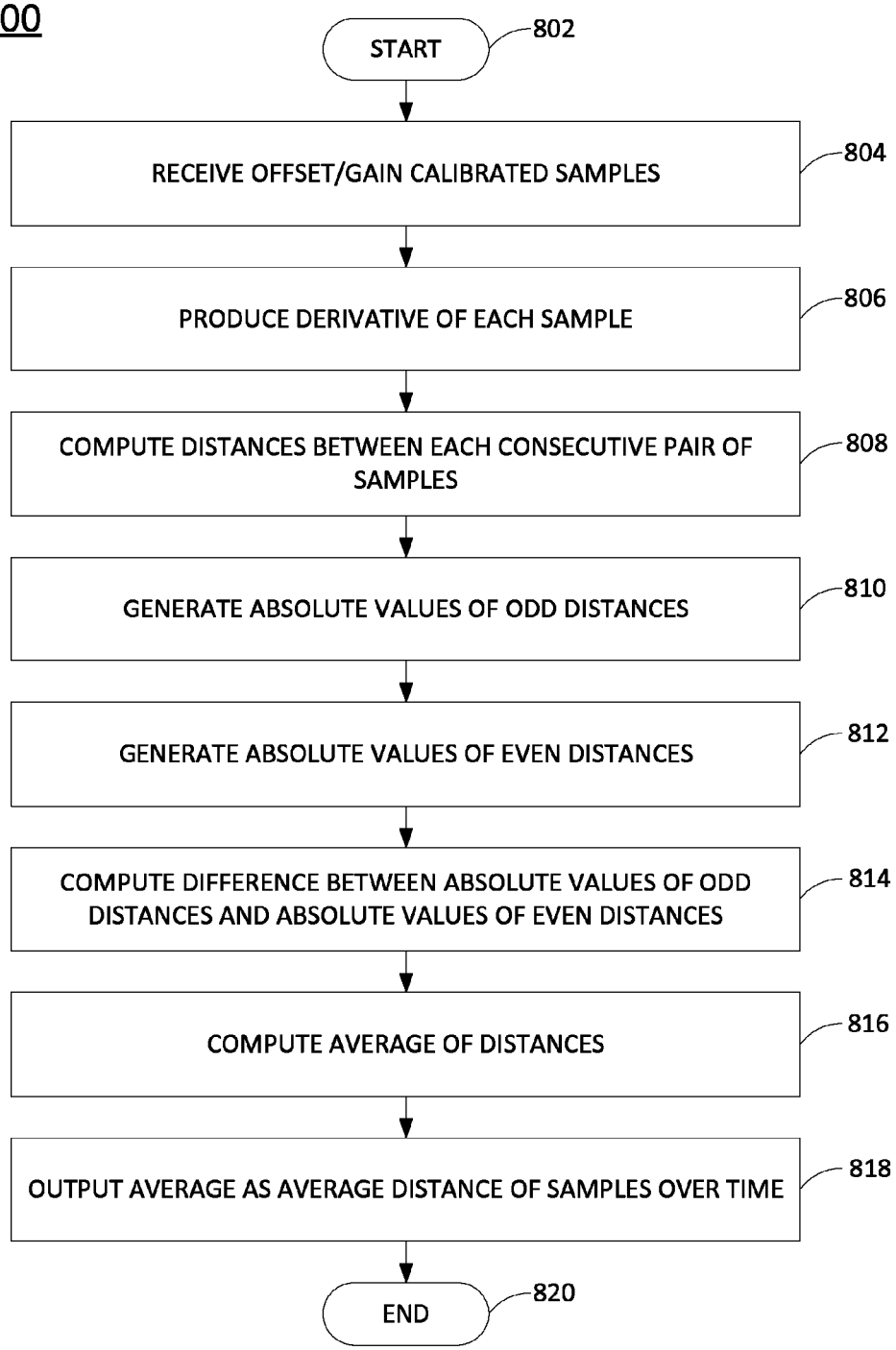
FIG. 8 is a flow diagram illustrating a method for extracting time skew among the two interleaved channels of an analog-to-digital converter.

FIG. 8 is a flow diagram illustrating a method 800 for extracting time skew among the two interleaved channels of an analog-to-digital converter. The method 800 may be implemented, for example, by a time skew extractor circuit such as the circuit 700 illustrated in FIG. 7. For ease of illustration, reference is made in the discussion of the method 800 to various components of the time skew extractor circuit 700. However, the method 800 is not necessarily limited to implementation in a circuit configured precisely as illustrated in FIG. 7; thus, such references are intended to be illustrative rather than limiting.

The method 800 begins in step 802. In step 804, the flip flop 706 receives the offset/gain calibrated samples measured by the interleaved channels of the ADC. As discussed above, the samples comprise instances of the digital codes (i.e., digital numbers representing the analog signal) resulting from conversion of the input signal. In step 806, the flip flop 706 produces the derivative of each of these samples.

In step 808, the first subtractor 702 computes the distances (e.g., $x_2(k)-x_1(k)$; $x_1(k+1)-x_2(k)$; etc.) between each consecutive pair of samples (e.g., between a sample and its derivative).

In step 810, the first bit manipulator 708 generates the absolute values of the odd distances computed by the first subtractor 702. As discussed above, this results in the generation of $|x_1'|$, which represents all odd absolute values of the signal derivative.

In step 812, the second bit manipulator 710 generates the absolute values of the even distances computed by the first subtractor 702. As discussed above, this results in the generation of $|x_2'|$, which represents all even absolute values of the signal derivative.

In step 814, the second subtractor 704 computes the difference between absolute values of the odd distances and the absolute values of the even distances (i.e., $|x_1'|-|x_2'|$).

In step 816, the averaging circuit 712 computes the average of the differences calculated by the second subtractor 704. As discussed above, this average represents the average distance of the samples over time, and is thus proportional to the average time skew ($\alpha \Delta t$).

In step 818, the averaging circuit 712 outputs the average difference, which represents the average distance of the samples over time, for example to a calibration loop controller or other device that is capable of calibrating the ADC to compensate for the time skew.

The method 800 ends in step 820.

It should be noted that although not explicitly specified, one or more steps of the methods described herein may include a storing, displaying and/or outputting step as required for a particular application. In other words, any data, records, fields, and/or intermediate results discussed in the methods can be stored, displayed, and/or outputted to another device as required for a particular application. Furthermore, steps or blocks in the accompanying Figures that recite a determining operation or involve a decision, do not necessarily require that both branches of the determining operation be practiced. In other words, one of the branches of the determining operation can be deemed as an optional step. In addition, unless stated otherwise, the steps of the methods described herein do not necessarily need to be performed in the order illustrated in the Figures. For instance, some of the described steps may be performed in parallel (e.g., substantially simultaneously), even though they may be illustrated in an ordered sequence.

While the foregoing describes exemplary embodiments in accordance with one or more aspects of the present disclosure, other and further embodiments in accordance with the one or more aspects of the present disclosure may be devised without departing from the scope thereof, which is determined by the claims that follow and equivalents thereof. Claims listing steps do not imply any order of the steps.

What is claimed is:

1. An integrated circuit, comprising:
 a first subtractor having inputs coupled to outputs of a plurality of channels of an interleaved analog-to-digital-converter;
 wherein the first subtractor computes distances between samples of a signal that are measured consecutively by pairs of channels in the plurality of channels;
 an array of averaging circuits;
 wherein at least some averaging circuits in the array of averaging circuits compute an average of those of the distances corresponding to a respective one of the pairs of channels;
 wherein one averaging circuit in the array of averaging circuits computes an average of all of the distances;
 an array of subtractors, separate from the first subtractor;
 wherein each subtractor in the array of subtractors computes a difference between an average computed by one of the at least some of the averaging circuits and the average of all of the distances; and wherein the difference is proportional to a time skew between one of the pairs of the channels corresponding to the average computed by one of the at least some of the averaging circuits.

2. The integrated circuit of claim 1, further comprising:
a bit manipulator for generating absolute values of the distances computed by the first subtractor;
wherein the bit manipulator has an input coupled to an output of the first subtractor.

3. The integrated circuit of claim 2, further comprising:
a demultiplexer for differentiating between the pairs of channels that correspond to each of the absolute values of the distances;
wherein an input of the demultiplexer is coupled to an output of the bit manipulator, and each output of the demultiplexer is coupled to an input of one of the at least some of the averaging circuits.

4. The integrated circuit of claim 3, wherein the output of the bit manipulator is further coupled to the one averaging circuit in the array of averaging circuits.

5. The integrated circuit of claim 4, wherein each subtractor in the array of subtractors has a first input coupled to an output of the one averaging circuit in the array of averaging circuits and a second input coupled to one of the at least some of the averaging circuits.

6. The integrated circuit of claim 1, further comprising:
a flip flop coupled to the outputs of the plurality of channels, for producing derivatives of the samples.

7. The integrated circuit of claim 6, wherein an output of the flip flop is coupled to an input of the first subtractor.

8. The integrated circuit of claim 1, wherein the samples comprise instances of digital codes resulting from analog-to-digital conversion of the signal.

9. The integrated circuit of claim 1, wherein outputs of each subtractor in the array of subtractors are coupled to inputs of a calibration loop controller.

10. A method for extracting a plurality of time skews between a plurality of channels of an interleaved analog-to-digital converter, the method comprising:
computing distances between pairs of samples of a signal that are measured consecutively by pairs of channels in the plurality of channels;
computing averages of those of the distances corresponding to each of the pairs of channels;
computing an average of all of the distances; and
computing differences between each of the averages corresponding to each of the pairs of channels and the average of all of the distances;
wherein the differences are proportional to the time skews between corresponding pairs of channels.

11. The method of claim 10, wherein the extracting is performed without the use of multiplier circuitry.

12. The method of claim 10, wherein the computing the averages of those of the distances corresponding to each of the pairs of channels and the computing the average of all of the distances both operate on absolute values of the plurality of distances.

13. The method of claim 12, wherein the absolute values are generated by flipping bits that represent whether the distances have positive or negative values.

14. The method of claim 10, wherein:
the computing the distances comprises producing derivatives of the samples; and
a derivative of a given one of the samples represents a sample measured on a clock cycle after a clock cycle on which the given one of the samples is measured.

15. The method of claim 10, wherein the samples comprise instances of digital codes resulting from analog-to-digital conversion of the signal.

16. The method of claim 10, further comprising:
outputting the differences to a calibration loop controller.

17. An integrated circuit, comprising:
a flip flop having an input coupled to an output of a first channel of an interleaved analog-to-digital-converter and to an output of a second channel of the interleaved analog-to-digital-converter, for producing derivatives of samples of a signal that are measured by the first channel and the second channel;
a first subtractor having inputs coupled to the output of a first channel, to the output of the second channel, and to an output of the flip flop, for computing distances between the samples and those of the derivatives corresponding to the samples;
a first bit manipulator having an input coupled to an output of the first subtractor, for generating the absolute values of those of the distances having odd-numbered values;
a second bit manipulator having an input coupled to an output of the first subtractor, for generating the absolute values of those of the distances having even-numbered values; and
a second subtractor having inputs coupled to outputs of the first bit manipulator and the second bit manipulator, for computing a difference between absolute values of those of the distances having odd-numbered values and absolute values of those of the distances having even-numbered values.

18. The integrated circuit of claim 17, further comprising:
an averaging circuit having an input coupled to an output of the second subtractor, for computing an average of the difference over time;
wherein the average of the difference represents an average distance of the samples over time.

19. The integrated circuit of claim 18, wherein an output of the averaging circuit is coupled to an input of a calibration loop controller.

* * * * *